USOO5754066A

United States Patent [19]
Smith

[11] Patent Number: 5,754,066
[45] Date of Patent: May 19, 1998

[54] OUTPUT STAGE FOR BUFFERING AN ELECTRICAL SIGNAL AND METHOD FOR PERFORMING THE SAME

[75] Inventor: Douglas L. Smith, Tucson, Ariz.

[73] Assignees: Maxim Integrated Products, Sunnyvale, Calif.; Gain Technology Corp., Tucson, Ariz.

[21] Appl. No.: 665,370

[22] Filed: Jun. 19, 1996

Related U.S. Application Data

[60] Provisional application No. 60/000,726 Jun. 30, 1995.
[51] Int. Cl.⁶ .................................. H03B 1/00; H03F 3/04
[52] U.S. Cl. .......................... 327/108; 330/288; 330/291
[58] Field of Search ................................ 326/82, 83, 89; 327/52, 53, 108, 109; 330/288, 291, 299

[56] References Cited

U.S. PATENT DOCUMENTS

| 4,080,580 | 3/1978 | Takasaki et al. | 330/28 R |
|---|---|---|---|
| 4,366,442 | 12/1982 | Yamada | 330/51 |
| 4,371,843 | 2/1983 | Fang et al. | 330/253 |
| 4,751,474 | 6/1988 | Gola | 330/292 |
| 4,999,585 | 3/1991 | Burt | 330/288 |
| 5,121,060 | 6/1992 | Scott, III et al. | 330/288 |
| 5,212,457 | 5/1993 | Frey | 330/288 |
| 5,245,222 | 9/1993 | Carobolante | 330/299 |
| 5,359,295 | 10/1994 | Nishimura | 330/288 |
| 5,418,495 | 5/1995 | Harvey | 330/265 |
| 5,477,190 | 12/1995 | Brehmer et al. | 330/253 |
| 5,625,313 | 4/1997 | Etoh | 330/291 |

FOREIGN PATENT DOCUMENTS 52-50148  4/1977  Japan.

OTHER PUBLICATIONS

P.J. Walker, Output power transistors' non-linearity does not appear in amplifier transfer characteristic, Wireless World, vol. 81, No. 1480, pp. 560–562, Dec. 1975.

Primary Examiner—David C. Nelms
Assistant Examiner—Son Mai
Attorney, Agent, or Firm—Hickman Beyer & Weaver, LLP

[57] ABSTRACT

The present invention teaches a variety of output stages, buffer circuits, and power amplifiers as well as methods for buffering electrical signals. According to one embodiment of the present invention, an output stage includes an input, an output, an error stage coupled between the input and the output and responsive to a difference between an input signal present on the input and an output signal present on the output, the error stage being operative to generate a current control signal related to the difference between the input signal and the output signal, a current mirror coupled to the error stage and responsive to the current control signal to generate a demand driven current signal related to a magnitude of the current control signal, and an amplification stage coupled between the input and the output. Furthermore, the amplification stage is responsive to the input signal and to the demand driven current signal to generate the output signal on the output such that a voltage of the output signal is substantially equal to a voltage of the input signal. Some embodiments provide a unipolar output signal while other embodiments provide a bipolar output signal. In addition, a number of embodiments utilizing bipolar transistor technology, FET technology, and having different configurations which vary the current gain are taught.

35 Claims, 10 Drawing Sheets

OUTPUT STAGE FOR BUFFERING AN ELECTRICAL SIGNAL AND METHOD FOR PERFORMING THE SAME

CROSS-REFERENCE TO RELATED APPLICATION

This application claims the benefit of Smith's copending U.S. Provisional patent application Ser. No. 60/000,726, entitled "AN OUTPUT STAGE FOR BUFFERING AN ELECTRICAL SIGNAL AND METHOD FOR PERFORMING THE SAME," filed Jun. 30, 1995, which is incorporated herein by reference in its entirety.

DESCRIPTION

1. Technical Field

The present invention is related to electronic circuits for amplifying electrical signals. In particular, an output stage of an electronic circuit which buffers and, if necessary, power amplifies an electrical signal is contemplated.

2. Background Art

For an electronic circuit, the power efficiency of its output stage is related to the output stage's ability to supply load current and voltage as compared with the bias current and voltage supplied to the output stage. Ideally, the output stage would provide a maximum output voltage equal to the voltage supplied and an output current which is not limited by the current amplification of the output stage. Unfortunately, due to practical limitations of common electrical components such as the transistor, this is not a realizable goal.

With reference to FIG. 1, a basic output stage 10 for one electronic circuit of the prior art will be described. As will be appreciated, the basic output stage 10 is a well know emitter-follower circuit. The basic output stage 10 includes a voltage source 12 connected to a power rail 14, a current generator 16, an npn transistor 18, and a pnp transistor 20. The npn transistor 18 has a collector 22 coupled to the power rail 14, a base 24, and an emitter 26 at which an output signal having a voltage $V_{out}$ and a current $I_{out}$ is generated. The current generator 16 has a first active terminal 30 coupled to the power rail 14 and a second active terminal 28 coupled to the base 24 of the npn transistor 18. A substantially constant current $I_s$ flows between the first active terminal 30 and the second active terminal 28 and serves to bias the pnp transistor 20.

The pnp transistor 20 has an emitter 32 coupled together with the second active terminal 28 and the base 24 of the npn transistor 18, a base 34, and a collector 36 which is coupled to a ground reference 38. The output stage 10 also includes an input terminal 40 and an output terminal 42. The output stage 10 is responsive to an input signal on the input 40, the input signal having a voltage $V_{in}$, and a current $I_{in}$, to generate the output signal at the output 42.

The basic output stage of FIG. 1 presents an output-current versus bias current compromise. That is, the larger the bias current $I_s$, the less efficient the circuit is. Yet, the maximum output current $I_{out}$ is limited by the magnitude of the bias current $I_s$. This may be shown as follows. The npn transistor 18 supplies the output current Iout to drive an output load $R_1$. To do so, npn transistor 18 draws a base current $I_{B2}$ from the bias supply current $I_s$, provided by the constant current generator 16. The bias supply current $I_s$, provides both base current $I_{B2}$ to the base 24 of the npn transistor 18 and an emitter bias current $I_{E1}$ to pnp transistor 20. Thus the controlling current relation is $I_s=I_{B2}+I_{E1}$. As will be apparent, the input voltage $V_{in}$, varies the current $I_{E1}$ to control the available base current $I_{B2}$ delivered to the emitter-follower transistor 18 (i.e. as $I_{E1}$ decreases, $I_{B2}$ increases accordingly).

As will be well familiar to those skilled in the art, the npn transistor 18 has a current gain β due to the transistor effect. Thus, within an operating range of the npn transistor 18, the output current $I_{out}=\beta*I_{B2}$. However, the limit of the operating range of output stage 10 is reached when $I_{B2}$ consumes the total available current (i.e. $I_{B2} \approx I_s$). Then, $I_{E1} \approx 0$ and the maximum output current $I_{out} \approx \beta*I_s$. Note that this current limit directly limits the load which the output stage 10 can drive.

In addition to the current limit problem described in the preceding paragraph, the output stage 10 has further deficiencies. For example, as the emitter current $I_{E1}$, becomes small, the bandwidth of the pnp transistor 20 declines significantly, thereby limiting the overall bandwidth of the output stage 10. One simplistic solution is to increase the available $I_s$. However, an increase in $I_s$, decreases the current efficiency of the circuit 10 and is thus in contrast to the stated need for a current efficient output stage.

Nevertheless, as will be appreciated by those skilled in the art, the output stage 10 provides the best voltage efficiency that can be expected for the emitter-follower output configuration. The maximum output voltage $V_{out}$, available with a voltage $V_{30}$ of voltage source 12 depends upon the series voltage drops in the path separating the voltage source 12 and the output at the emitter 26. The voltage across the constant current source 16 can reduce to a small saturation voltage $V_{sat}$, while the drop across the npn transistor 18 is a substantially constant $V_{BE2}$. Thus the maximum $V_{out}=V_+ -V_{SAT}-V_{BE2}$.

Turning next to FIG. 2, one prior art solution to the current limiting deficiency of FIG. 1 will be described. Since FIG. 2 is a direct modification of the output stage 10 of FIG. 1, like components will be referred to by like reference numerals. In addition, many of the electrical interconnections are similar. Therefore, these common interconnections and the resulting electrical behavior will not be described in detail, except as necessary for a clear understanding.

As will be appreciated, FIG. 2 illustrates a common circuit known as a Darlington emitter-follower circuit 50. The Darlington circuit 50 introduces a second npn transistor 52 having a base 54 connected in series with the emitter 26 of the first npn transistor 18. The second npn transistor 52 also has a collector 56 coupled to the power rail 14 and an emitter 58. In contrast to the basic output stage 10 of FIG. 1, in FIG. 2 the emitter 26 of the first npn transistor 18 drives the second npn transistor 52 which in turn supplies the output current $I_{out}$ to the output load $R_1$. To do so, the second npn transistor 52 draws a base current $I_{E2}$ from the emitter 26 of the first npn transistor 18.

Similar to FIG. 1, $I_s=I_{B2}+I_{E1}$. Thus $I_{B2}$ is still limited to the current $I_s$, in turn limiting $I_{E2}$ to $\beta_1*I_{B2}$. However, the emitter current $I_{E2}$ is amplified by the second emitter-follower transistor 26 to generate the output current Iout. Thus, assuming the first and second npn transistors 18 and 52 have current gains of $\beta_1$ and $\beta_2$, respectively, the maximum value of $I_{out}=\beta_1*\beta_2*I_s$. Hence the potential available output current $I_{out}$ is greatly increased without increasing the quiescent current of $I_s$.

However, the additional amplification stage embodied in the second npn transistor 52 introduces its own problems. For example, an additional $V_{BE}$ voltage drop is introduced across the base 54 and the emitter 58 of the second npn transistor 52. As a result, the maximum output voltage reduces to $V_{OUT}=V_+-V_{SAT}-2*V_{BE}$. The added $V_{BE}$ reduction of $V_{OUT}$ imposes a significant limitation to Darlington circuits 50, especially those running from lower-voltage power sources.

In addition, the Darlington circuit 50 adds distortion in the input-to-output transfer function through non-linear variations in $V_{BE2}$. As will be appreciated by those skilled in the art, a variation in output current $I_{out}$ will produce a nonlinear, logarithmic variation in $V_{BE2}$ which increases distortion in the circuit output signal. Furthermore, as any transistor's bandwidth is finite, the addition of the second npn transistor 52 will decrease the overall bandwidth of the Darlington circuit 50.

FIG. 3 illustrates a prior art circuit 100 useful for correcting the error introduced by the nonlinear variation in $V_{BE2}$ of the Darlington circuit 50 of FIG. 2. The principles of this circuit are taught by Hawksford in "Power Amplifier Output Stage Design Incorporating Feedback Correction with Current Dumping Enhancement", Audio Engineering Society Preprint, 1993, B-4.

The circuit 100 reduces the $V_{BE2}$ distortion by adding a feedback controlled current mirror 102 into the Darlington circuit 50 of FIG. 2. The feedback controlled current mirror 102 is formed by introducing second and third pnp transistors 110 and 112, and resistors $R_E$ and $R_B$. A base 116 of the second pnp transistor 110, a base 122 of the third pnp transistor 112, and a collector 118 of the second pnp transistor 112 are coupled together and to the collector 22 of the first npn transistor 18.

The current mirror 102 supplies much of the $I_{B3}$ base current demand thereby reducing the effect of the current variations in the first npn transistor 18. This is accomplished as follows. Base current $I_{B3}$ flows through the base resistor $R_B$, developing a voltage that also drops across the emitter resistor $R_E$. The emitter resistor $R_E$ effectively adjusts the current $I_{E2}$ such that $I_{E2} \approx (I_{B3}*R_B+V_{BE3})/R_E$. Additionally, a base current $I_{C2}$ flowing into the base 122 of the third pnp transistor 112 is approximately equal to the emitter current $I_{E2}$. As will be well familiar to those skilled in the art, the current flowing out of the collector 126 of the third pnp transistor 112 is $mI_{C2}$, where m is a ratio of an emitter area $A_4$ of the third pnp transistor 112 to an emitter area $A_3$ of the second pnp transistor 110 (i.e. $m=A_4/A_3$). Thus if the emitter area $A_4$ and $A_3$ are chosen properly, the current $mI_{C2}$ is much greater than $I_{E2}$. Thus, since $I_{B3}=m*I_{C2+IE2}$, the base drive current $I_{B3}$ comes primarily from the current mirror and not from the nonlinear current $I_{E2}$.

Accordingly, the output stage 100 of FIG. 3 improves the distortion problem described in the Darlington circuit 50 of FIG. 2. However, the voltage efficiency is greatly decreased. By way of explanation, each of the npn transistors 18 and 52 introduce a $V_{BE}$ voltage drop. In addition, the transistors of current mirror 102 have a saturation voltage drop $V_{SAT}$. Finally, the base resistor $R_B$ introduces a voltage drop $V_{RB}$. Thus the maximum voltage $V_{OUT}=V_+-V_{SAT}-2V_{BE}-V_{RB}$.

What is needed is an output stage which has the voltage efficiency of the basic output stage 10, the current efficiency of the Darlington output stage 50, and the low distortion qualities of the output stage 100 of FIG. 3.

DISCLOSURE OF THE INVENTION

In order to achieve the foregoing and in accordance with the present invention, a variety of output stages, buffer circuits, and power amplifiers as well as methods for buffering electrical signals are disclosed.

According to a first embodiment of the present invention, an output stage includes an input, an output, an error stage coupled between the input and the output and responsive to a difference between an input signal present on the input and an output signal present on the output, the error stage being operative to generate a current control signal related to the difference between the input signal and the output signal, a current mirror coupled to the error stage and responsive to the current control signal to generate a demand driven current signal related to a magnitude of the current control signal, and an amplification stage coupled between the input and the output. Furthermore, the amplification stage is responsive to the input signal and to the demand driven current signal to generate the output signal on the output such that a voltage of the output signal is substantially equal to a voltage of the input signal.

In a related embodiment of the present invention, the current mirror is comprised of a first and a second transistor each having a base, a collector, and an emitter. For each transistor, a control signal applied to its base can control a flow of current through that transistor between the collector and the emitter. The base and collector of the first transistor and the base of the second transistor are electrically coupled together and are coupled to the current control signal. Additionally, the emitters of both the first and second transistors are electrically coupled together and are electrically coupled to a power source. As a result, in part, of this configuration, the demand driven current signal is generated at the collector of the second transistor.

In a first closely related embodiment, both the first and second transistors are pnp transistors. In a second closely related embodiment, both the first and second transistors are n-channel FETs.

In another related embodiment the error stage includes a first and a second transistor each having a base, a collector, and an emitter. The base of the first transistor and the emitter of the second transistor are electrically coupled together and coupled to a substantially constant current source. Also, the base of the second transistor is electrically coupled to the input, the collector of the second transistor is electrically coupled to a ground reference, and the emitter of the first transistor is electrically coupled to the output. Due in part to this configuration, the current control signal is generated at the collector of the first transistor.

In yet another related embodiment, the amplification stage includes a first and second transistor, each having a base, a collector, and an emitter. The base of the second transistor is electrically coupled with the input. Furthermore, the base of the first transistor and the emitter of the second transistor are electrically coupled together and are coupled to the demand driven current signal. Due in part to this configuration, the output signal is generated at the emitter of the first transistor which is electrically coupled with the output.

In still another related embodiment the output stage is a bipolar output stage operable to provide bipolar currents through the output.

According to a separate embodiment, a power amplification circuit comprises an amplifier operative to generate a power amplified output signal from an input signal having a voltage $V_{in}$ and a current $I_{in}$, the output signal having a voltage $V_{out}$ and a current $I_{out}$, wherein the power amplification is achieved mainly by amplifying a demand driven current $I_d$ by a desired amplification factor to generate $I_{out}$ such that $I_{out}$ is greater than $I_{in}$, and a demand driven current source arranged to sense the difference between $V_{out}$ and a desired $V_{out}$ and generate the demand driven current $I_d$ such that a magnitude of the difference between $V_{out}$, and the desired $V_{out}$ is reduced and the demand driven current $I_d$ is minimized.

In a related embodiment, the output signal is generated across a load $R_1$ and the current Iout drives the load $R_1$ to generate $V_{out}$. In another related embodiment, the power amplification circuit supplies a bipolar output current Iout. However, in other embodiments the power amplification circuit supplies a unipolar output current Iout.

According to one aspect of the present invention, a method of buffering an electrical signal comprises the steps of receiving an input signal having a voltage $V_{in}$ and a current $I_{in}$, generating a buffered output signal from the input signal, the output signal having a voltage $V_{out}$ and a current $I_{out}$, the current $I_{out}$, being generated such that a resistive load $R_1$, driven by the output signal has a minimal effect on the voltage $V_{out}$, wherein the current $I_{out}$ is produced mainly by amplifying a demand driven current $I_d$ to generate $I_{out}$, sensing a difference between the $V_{out}$ and a desired $V_{out}$, providing a current control signal $I_c$ related to the difference between the $V_{out}$ and the desired $V_{out}$ and generating a demand driven current $I_d$ by amplifying the current control signal $I_c$, the current $I_d$ generated such that the difference between $V_{OUT}$ and the desired $V_{OUT}$ is reduced while the demand driven current $I_d$ is minimized.

BEST MODES FOR CARRYING OUT THE INVENTION

Figure 4:
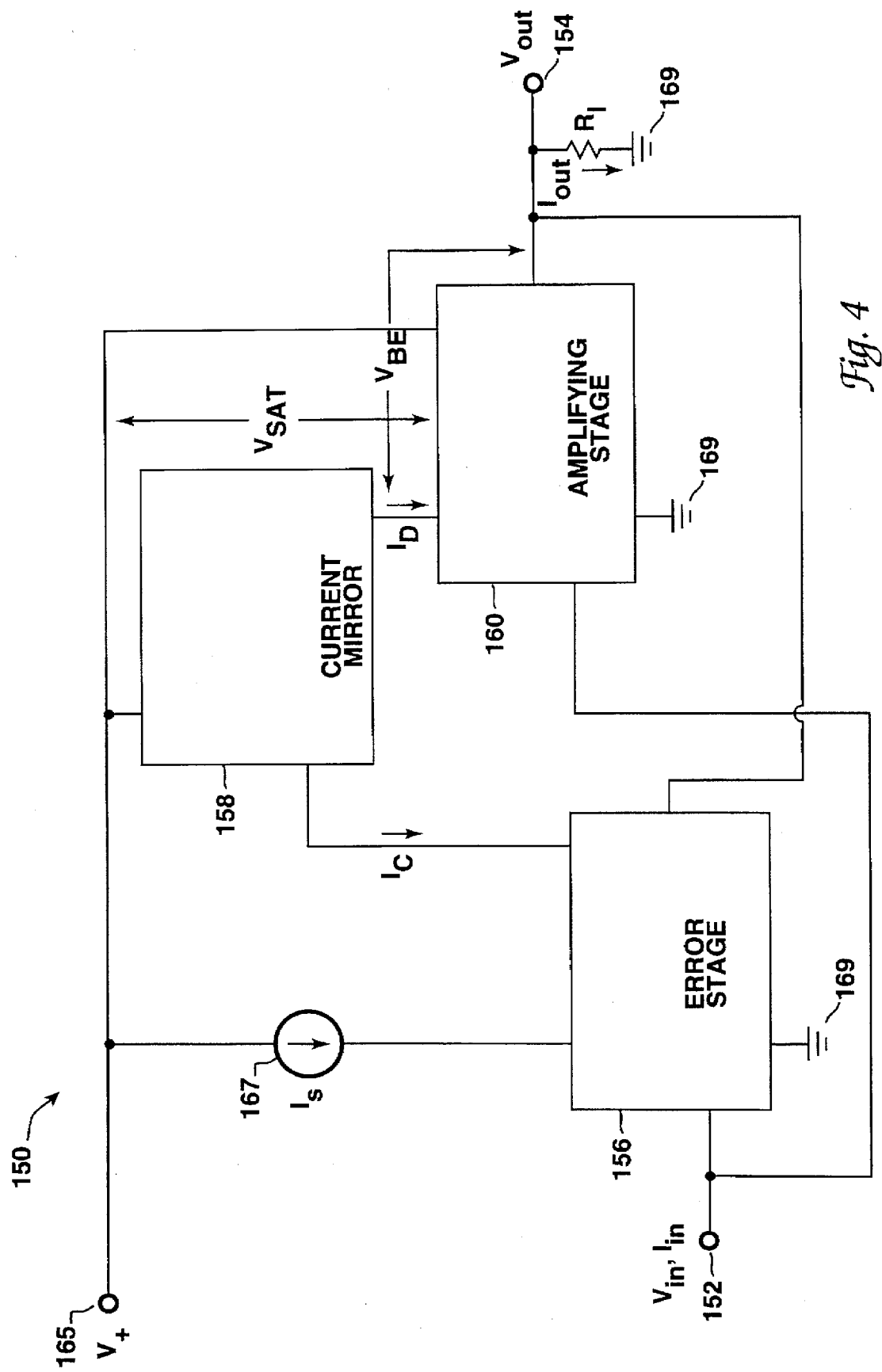
FIG. 4 is a block diagram illustration of an output stage in accordance with one embodiment of the present invention, the output stage having an error stage, a current mirror, and an amplifying stage.

With reference to FIG. 4, an output stage 150 in accordance with one embodiment of the present invention will be described. The output stage 150 includes an input 152, and output 154, an error stage 156, a current mirror 158 and an amplifying stage 160. Also shown in FIG. 4 is a voltage supply 165 supplying a voltage $V_+$, a current source 167 supplying a current $I_s$, an input signal present on the input 152 having a voltage $V_{in}$ and a current $I_{in}$, an output signal present on the output 154 having a voltage $V_{out}$ and current $I_{out}$, and an output load $R_1$ coupled across the output 154 and a ground reference 169.

The error stage 156 is coupled between the input 152 and the output 154 and is able to sense a difference between the input 152 and the output 154. Furthermore, the error stage 156 is coupled to the current mirror 158 and is responsive to the difference between the input 152 and the output 154 to generate a current control signal $I_c$ which is related to the difference and drives the current mirror 158. Note that the current source 167 provides a biasing current $I_s$ to the error stage 156.

The current mirror 158 is coupled to the amplifying stage and responds to the demand of the current control signal $I_c$ by generating a demand driven current signal $I_d$ which drives the amplifying stage 160. In the embodiment shown in FIG. 4, the current mirror 158 and the current source 167 both receive power from the voltage supply 165. However, in other suitable embodiments, the current source 167 and the current mirror 158 may be powered by different voltage supplies.

In some embodiments, the current source 167 may be replaced with a resistor $R_s$. In these embodiments the bias current $I_s$ is generated by the voltage drop across $R_s$. As will be appreciated, each of these embodiments will have specific advantages. Utilizing only a resistor $R_s$ to generate the current $I_s$ produces a less complex circuit which may be more cost effective. However, active current sources such as current source 167 may be better suited for the environment under which the output stage 150 is designed to operate. The thermal coefficient of an active current source may be designed to behave predictably, and perhaps advantageously, under the anticipated operating conditions. In contrast, a resistor $R_s$ will typically degrade performance of the output stage 150 under varying operating conditions.

The amplifying stage 160 is connected across the input 152 and the output 154 and in parallel with the error stage 156. In general, the amplifying stage 160 is responsive to the combination of the input signal and the demand driven current signal $I_d$ to generate the output signal having a voltage $V_{out}$ and a current $I_{out}$. Additionally, the output signal is limited by the demand driven current signal $I_d$ provided to the amplifying stage.

According to the present invention, the current mirror 158 provides a variable, demand driven biasing current to the amplifying stage 160 as follows. When the error stage 156 senses a voltage difference between the input signal and the output signal, the error stage increases the current control signal $I_c$ correspondingly. In response, the current mirror 158 mirrors and amplifies $I_c$ to generate a correspondingly larger demand driven current signal $I_d$. This raises the bias current $I_d$ to the amplifying stage 160 enabling the amplifying stage 160 to increase the output current $I_{out}$, thereby increasing $V_{out}$. Similarly, as the output voltage $V_{out}$ decreases corresponding to a decrease in $V_{in}$, then the demand driven current $I_d$ will decrease.

Each of the three stages has a corresponding current gain factor: For the error stage, the current gain $\beta_{es}$; for the current mirror stage, the current gain $\beta_{cm}$; and for the amplifying stage, the current gain $\beta_{as}$. In essence, increasing each of these gains will produce a corresponding increase in a maximum value of the output current $I_{out}$. As will be seen, these gains can be varied in a number of ways. However, in practice, the change in gain and the method of changing the gain will have effects on the behavior of the output stage 150 beyond improving the output current limit. Thus careful consideration must be given to the design of the output stage 150, with different configurations chosen for different applications and to satisfy varying requirements.

In the described embodiments of the present invention, the output stage is implemented utilizing transistors and other well known electrical components. As will be appreciated by those skilled in the art, a control signal applied to the base of a transistor can control a flow of current through the transistor between the collector and the emitter. While there are a variety of transistors which are suitable for use in different embodiments of the present invention, the four types which will be described herein are type npn bipolar, pnp bipolar, n-channel FET (field effect transistor), and p-channel FET. Typically the terms base, collector, and emitter are used in the context of bipolar transistors, while the corresponding terms gate, drain, and source are used in the context of FETs. However, corresponding terms may be used interchangeably without causing confusion as the transistor type will be made clear from the context. As these transistor types are well familiar to those skilled in the art, additional description will be provided only as required.

Figure 5:
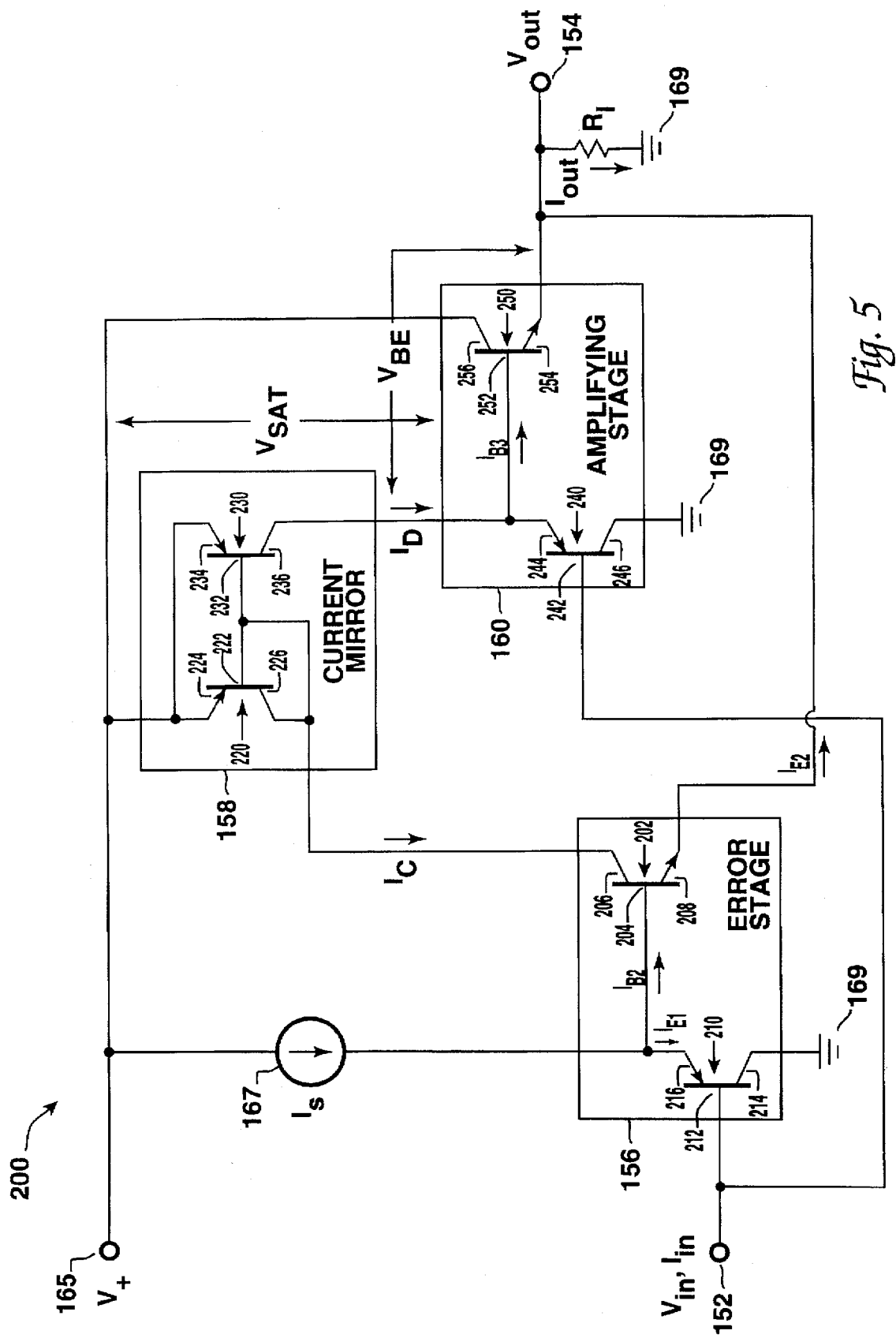
FIG. 5 is a schematic illustration of a unipolar output stage in accordance with another embodiment of the present invention.

With reference to FIG. 5, one suitable circuit 200 for implementing the output stage 150 in accordance with one embodiment of the present invention will be described. In the embodiment of FIG. 5, bipolar (npn and pnp) type transistors are utilized. The error stage 156 includes a first npn transistor 202 having a base 204, a collector 206, and an emitter 208, and a first pnp transistor 210 having a base 212, a collector 214, and an emitter 216. The input 152 is coupled to the base 212 of the first pnp transistor 210 such that the input signal will control flow of current $I_{E1}$ flowing through the first pnp transistor 210 between the emitter 216 and the collector 214.

The current source 167 is coupled to the emitter 216 of the first pnp transistor 210 and to the base 204 of the first npn transistor 202 such that a base current flow $I_{B2}$ driving the first npn transistor 202 is defined by the relationship $I_{B2}= I_s-I_{E1}$. Note that the current source 167 could be an active current source or a resistive current source, as previously described. Thus if the first npn transistor 202 has a current gain $\beta_2$, then the current control signal (which is the collector current of npn transistor 202) has a current $I_c \approx I_{E2} = \beta_2 * I_{B2}$ which, in the limit, becomes $I_c \approx \beta_2 * I_s$.

The current mirror 158 of FIG. 5 is of a well known construction and its operation will be well familiar to those skilled in the art. As will be appreciated, a variety of suitable embodiments exist which may be used as the current mirror 158. The current mirror 158 has a pair of pnp transistors: a pnp transistor 220 having a base 222, an emitter 224, and a collector 226; and a pnp transistor 230 having a base 232, an emitter 234, and a collector 236. Both bases 222 and 232 are coupled together and, further, coupled to the collector 226 of the pnp transistor 220. In turn, the bases 222 and 232 and the collector 226 are coupled with the current control signal $I_c$, i.e., the collector 206 of the first npn transistor 204 found in the error stage 156. Additionally, both emitters 224 and 234 are coupled together and to the voltage source $V_+$165.

As will be appreciated by those skilled in the art, the current gain $\beta_{cm}$ of the current mirror 158 of FIG. 5 is defined by the ratio of an emitter area $A_4$ of the pnp transistor 230 to an emitter area $A_3$ of the pnp transistor 220. Thus the current mirror 158 supplies a demand driven current signal $I_d = (A_4/A_3) * I_c$, which, in the limit, becomes $I_d = (A_4/A_3) * \beta_2 * I_s$. In preferred embodiments, $A_4$ is chosen greater than or equal to $A_3$ to provide a demand driven bias current $I_d$ to the amplifying stage 160 of FIG. 5 which is larger than that provided in the prior art solutions.

The amplifying stage 160 of FIG. 5 includes a pnp transistor 240 having a base 242, an emitter 244, and a collector 246, and a npn transistor 250 having a base 252, an emitter 254, and a collector 256. The base 242 of the pnp transistor 240 is coupled to and driven by the input 152. The emitter 244 and the base 252 are coupled together and with the demand driven current supply $I_d$, i.e., the emitter 236 of the current mirror. Given a current gain $\beta_5$ for the npn transistor 250, the maximum output current $I_{out} = \beta_5 * (A_4/A_3) * \beta_2 * I_s + I_{E2}$. The current $I_{E2}$ can be expressed in terms of $I_s$ and in the limit, $I_{E2} = \beta_2 * I_s$. Thus, $I_{out} = [\beta_5 * (A_4/A_3) + 1] * \beta_2 * I_s$.

As will be appreciated, the portion of the current $I_{out}$ due to the error stage 156 ($\beta_2 * I_s$) is an unintended component due to the specific embodiment of FIG. 5. However, the factor $\beta_5 * (A_4/A_3)$ is typically chosen much greater than unity so that $I_{out} \approx \beta_5 * (A_4/A_3) * \beta_2 * I_s$. Hence, most of the current $I_{out}$ comes from the amplifying stage 160.

Figure 1:
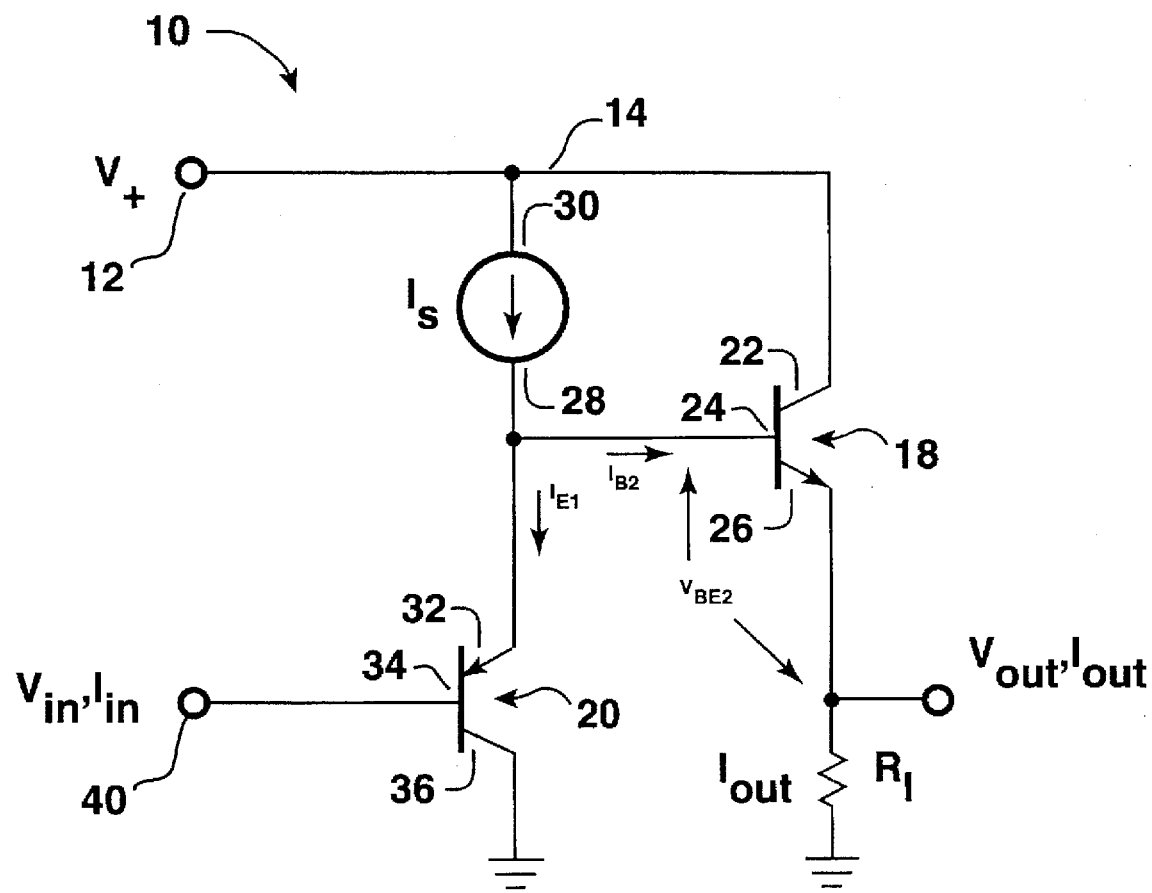
FIG. 1 is a schematic illustration of a basic output stage of the prior art.
Figure 2:
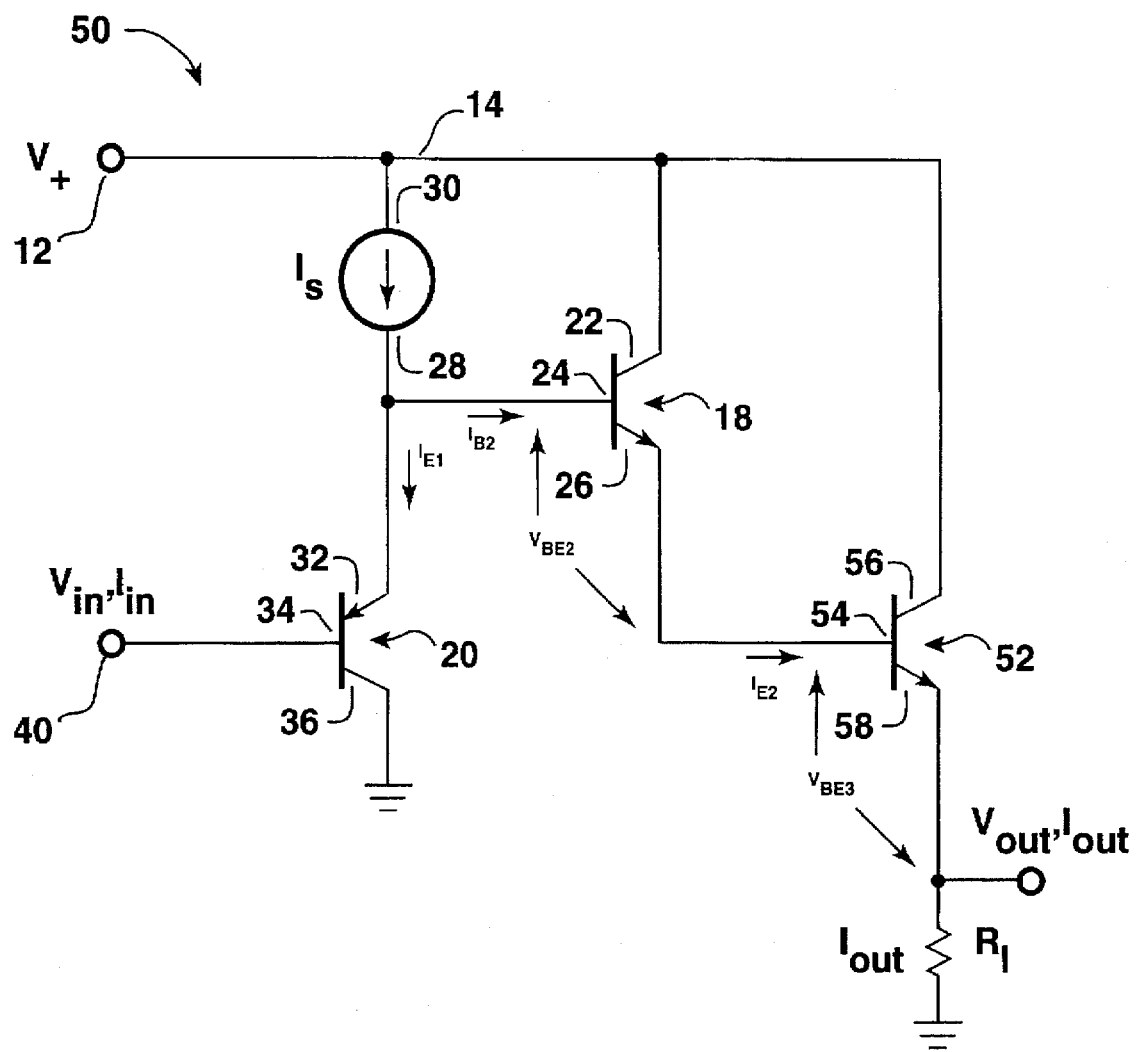
FIG. 2 is a schematic illustration of a Darlington output stage of the prior art.

In essence, the output stage 200 boosts the maximum available $I_{out}$ through the product of two transistor current gains $\beta_2$ and $\beta_5$ (similar to what is achieved in the Darlington circuit of 50 of FIG. 2) and, further, through a current gain of $A_4/A_3$. However, unlike the Darlington circuit 50, the output stage 200 of the present invention does not introduce further voltage drops over the output stage 10 of FIG. 1. In the limit, the voltage drop between $V_+$ and $V_{out}$ consists of $V_{SAT}$ through the current mirror 158 and $V_{BE}$ through the npn transistor 250. Thus the maximum output voltage $V_{out} = V_+ - V_{SAT} - V_{BE}$. Furthermore, load current conditions increase the critical demand driven current $I_d$ but unloaded conditions retain a desired low quiescent demand driven current $I_d$.

Figure 6:
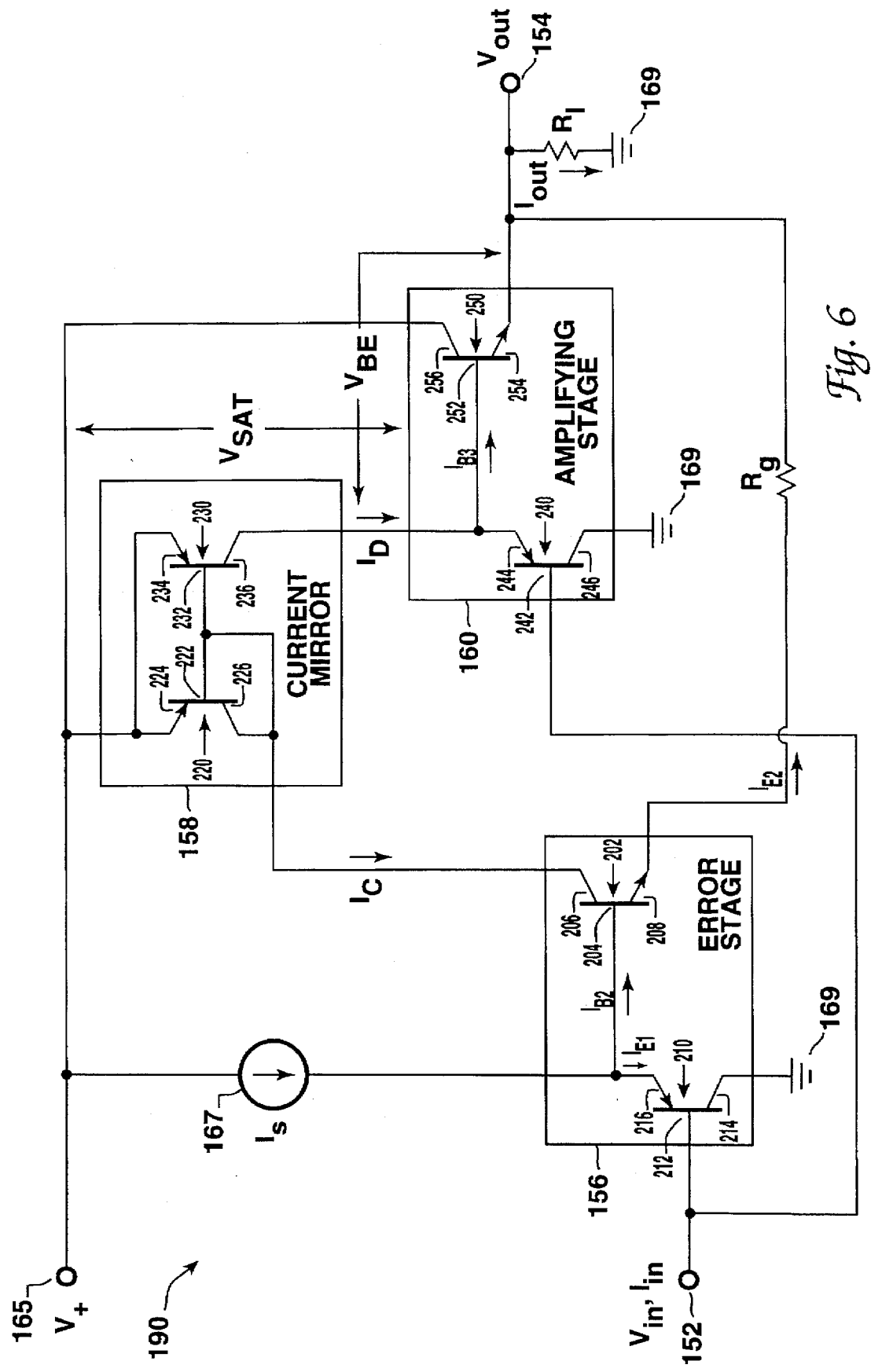
FIG. 6 is a schematic illustration of a unipolar output stage having a gain resistor $R_g$ in accordance with yet another embodiment of the present invention.
Figure 7:
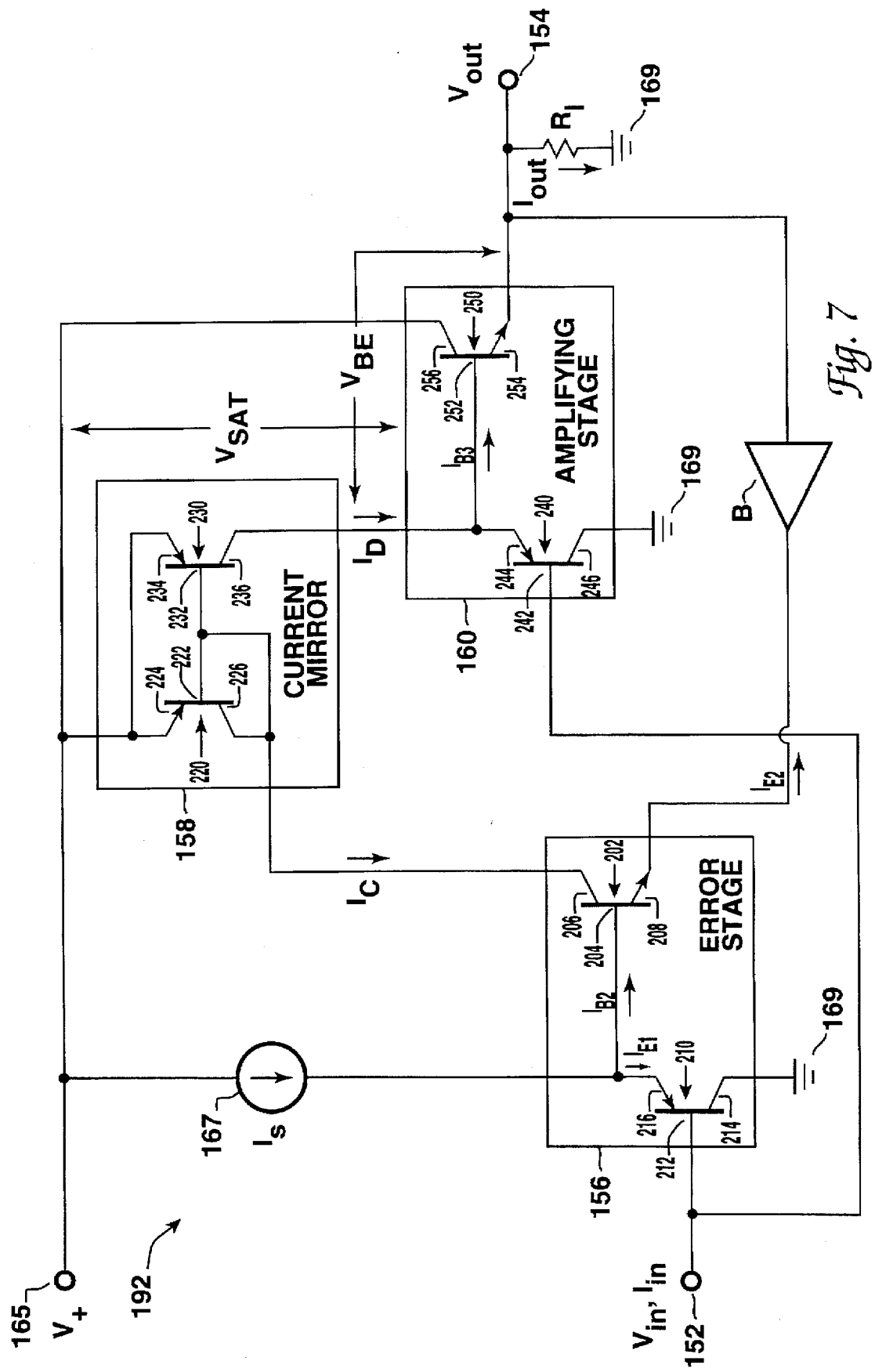
FIG. 7 is a schematic illustration of a unipolar output stage having a buffer amplifier coupled in series with the error stage and the output in accordance with another embodiment of the present invention.

For the embodiment described in FIG. 5, the current gains for each stage are as follows: $\beta_{es} = \beta_2$, the current gain of the first npn transistor 202; $\beta_{cm} = A_4/A_3$, the ratio of the current gain of the pnp transistor 230 to the current gain of the pnp transistor 220; and $\beta_{as} = \beta_5$, the current gain of the npn transistor 250. With reference to FIGS. 6 and 7, a couple of embodiments which can be used to alter gain and the corresponding effects on the behavior of the output stage will be described.

Directing attention to FIG. 6, an output stabe 190 in accordance with another embodiment of the present invention will be described. Output stage 190 is similar to output stage 200 of FIG. 5, but the output stage 190 further includes a resistor $R_g$ connected in series between the error stage 156 and the output 154. In essence, the resistor $R_g$ creates a voltage difference between the error stage and the output.

As will appreciated by those skilled in the art, proper selection of the value of $R_g$ can optimize distortion by limiting the output current supplied by the npn transistor 202 to that amount of current needed to supply the current mirror 158 and subsequently the base current of the primary output transistor, npn transistor 250. Emitter current $I_{E2}$ produces a variation in the VBE drop of the transistor 202 which in turn produces a distortion error signal within the error stage 156. Adding $R_g$ effectively degenerates the effect of the npn transistor 202 on the output current $I_{OUT}$, thereby reducing the distortion.

However, this degeneration also reduces the gain of the error stage 156 and potentially introduces a new, lower, limit to the maximum available output current $I_{OUT}$ of the overall circuit 190. Thus a proper selection of $R_g$ will both avoid this potential limit and minimize the distortion effect. It should be noted that insertion of a resistor $R_g$ in any embodiment of the present invention will have a similar effect on the behavior of the circuit as described above.

Turning next to FIG. 7, an output stage 192 in accordance with still another embodiment of the present invention will be described. Output stage 192 is similar to output stage 150 of FIG. 5, however, the output stage 192 further includes a buffer amplifier B in series between the error stage 156 and the output 154. Buffer amplifiers such as buffer amplifier B are well know to those skilled in the art. As very little current is required to drive the buffer amplifier B, the current of Iout comes mainly from the amplifying stage 160. Thus inserting the buffer amplifier B further reduces the nuisance current from the error stage.

Even greater benefit can be derived from the buffer amplifier B if its gain is greater than unity. This has a similar distortion effect as the resistor $R_g$ of FIG. 6 with the added benefit that the gain of error stage is increased. Turning to the downside, adding a buffer amplifier B requires more components than the embodiment of FIG. 5. Furthermore, the buffer amplifier B has a finite bandwidth and thus the overall bandwidth of output stage 192 is less than the overall bandwidth of output stage 200. Thus, whether to utilize a buffer amplifier B should depend upon the requirements of the intended application.

Figure 8:
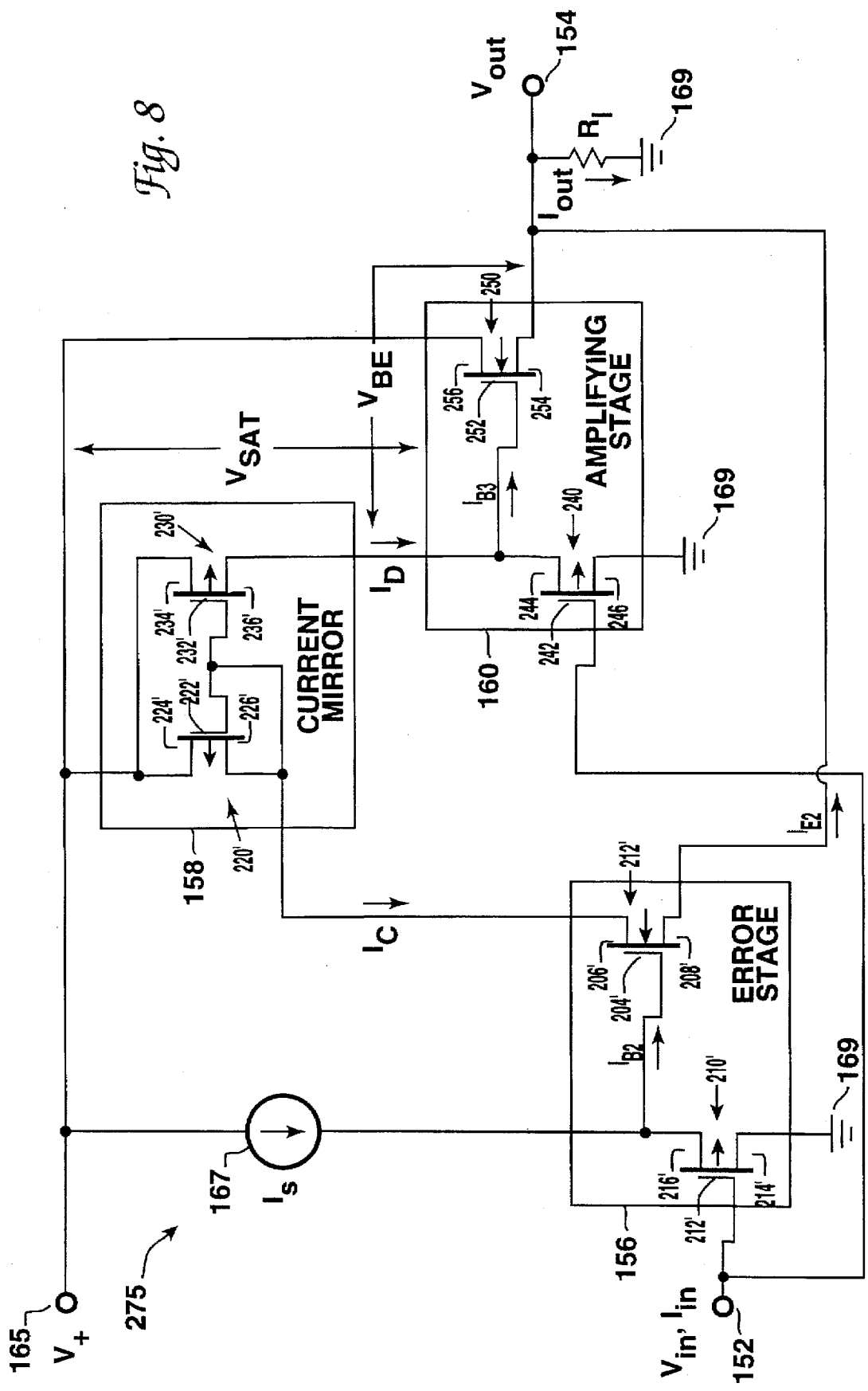
FIG. 8 is a schematic illustration of a unipolar output stage implemented with field effect transistor (FET) technology in accordance with one embodiment of the present invention.

With reference to FIG. 8, an output stage 275 in accordance with another embodiment of the present invention will be described. The output stage 275 is a variation of the output stage 200 of FIG. 5 which has advantages in certain applications, especially for alternating current (A/C) conditions. The embodiment of FIG. 8 is achieved by replacing the bipolar transistors of FIG. 5 with their corresponding FETs. That is, each npn transistor found in FIG. 5 is replaced with an n-channel FET in FIG. 8, and each pnp transistor found in FIG. 5 is replaced with a p-channel FET in FIG. 8.

For example, the first pnp transistor 210 becomes a p-channel FET 210', having a gate 212', a drain 214', and a source 216'. The first npn transistor 202 becomes a n-channel FET 202', having a gate 204', a drain 208', and a source 206'. As shown in FIG. 6, the naming convention of appending an apostrophe after the reference numeral can be systematically applied to appropriately name each modified element of the output stage 275 utilizing FET technology instead of bipolar technology.

Figure 3:
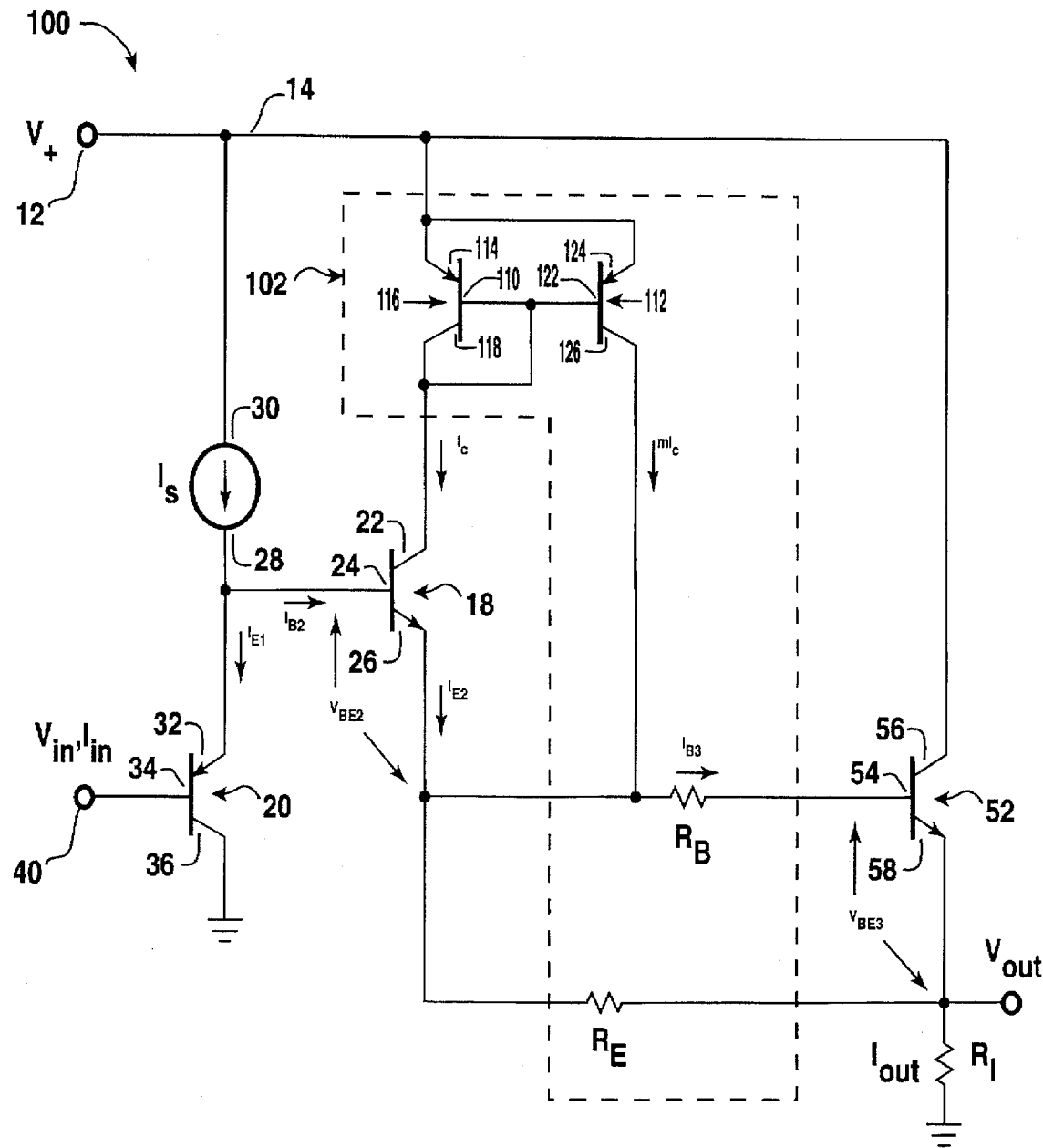
FIG. 3 is a schematic illustration of an output stage of the prior art which improves on the Darlington output stage of FIG. 2 by decreasing the distortion of the output signal.

FET devices have no direct equivalent to bipolar transistor base gain (typically the base current is very small, such that the current gain approaches infinity) and thus the defining current gains βes and βas of the embodiment of FIG. 5 do not have direct equivalents in the embodiment of FIG. 8. However, FETs do draw significant A/C gate current when signals charge the gate capacitance. Thus the output stage 275 of FIG. 8 results in improved A/C response due to the added drive current supplied to the gate of the output device. In addition, the embodiment of FIG. 8 will improve the known nonlinearities present in JFET type FET transistors, nonlinearities which can cause output signal distortion in prior art output stages such as shown in FIGS. 1-3.

Figure 9:
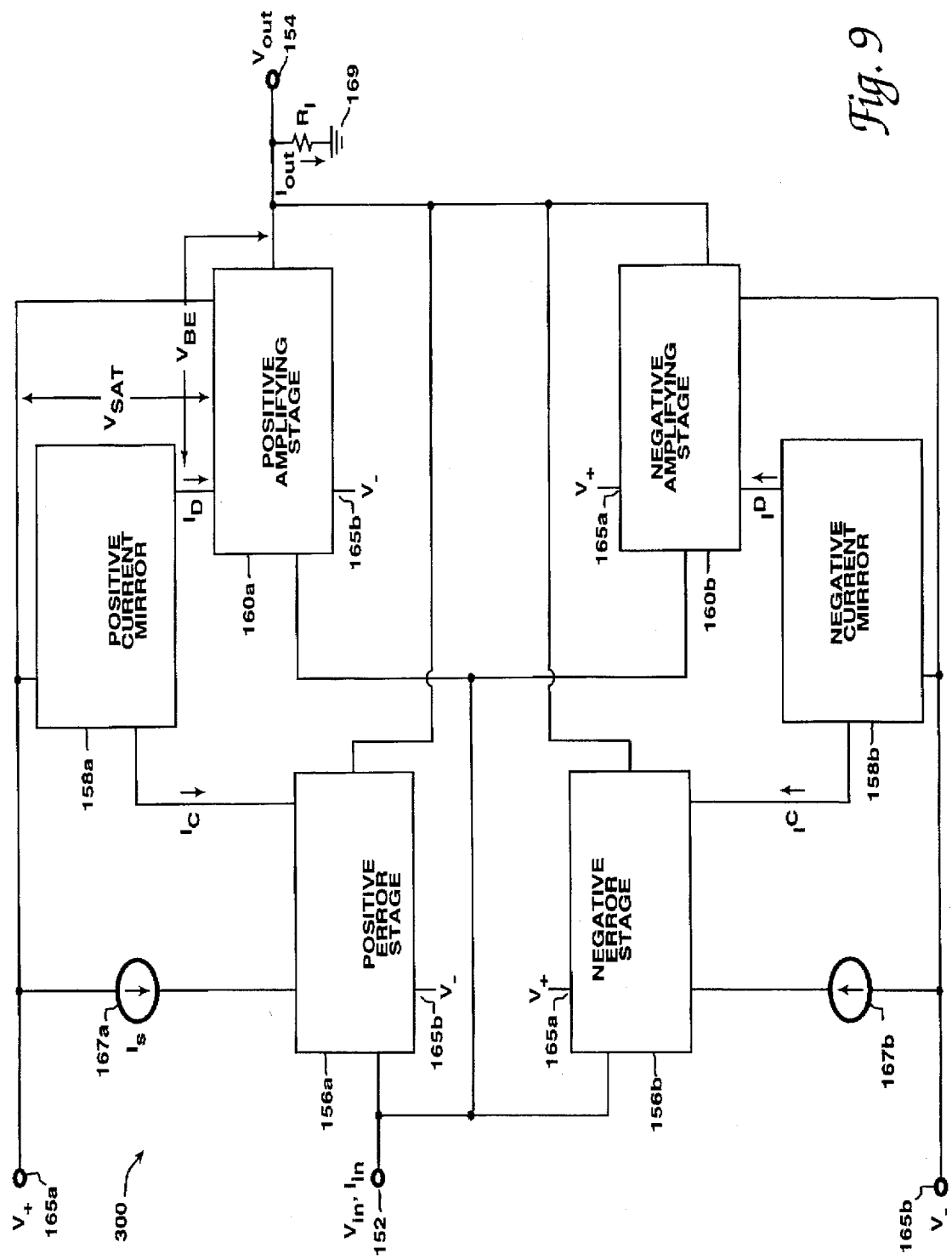
FIG. 9 is a block diagram illustration of a bipolar output stage in accordance with one embodiment of the present invention.

With reference to FIG. 9, a bipolar output stage 300 in accordance with a further embodiment of the present invention will now be described. As will be appreciated, the output stage 150 only supplies currents of one polarity through the amplifying stage 160. However, adding a mirror of this circuit to the original configuration enhances the output stage 150 into a bipolar output stage 300.

The original (non-mirrored) components of the output stage 300 are indicated with the marker "a" appended to their respective reference numbers while the mirrored components are indicated with the marker "b" appended to their respective components.

Additionally, the modifying terms "positive" and "negative" have been added to the names of the different stages. Thus the output stage 300 includes positive and negative error stages 156a and 156b, positive and negative current mirror stages 158a and 158b, and positive and negative amplifying stages 160a and 160b. Note that like components are coupled in the same manner. As will be apparent to those skilled in the art, the mirrored devices must have conductivity types opposite that of the original devices. For example, an npn type transistor in the positive error stage 156a would be mirrored as a pnp type transistor in the negative error stage 156b.

Figure 10:
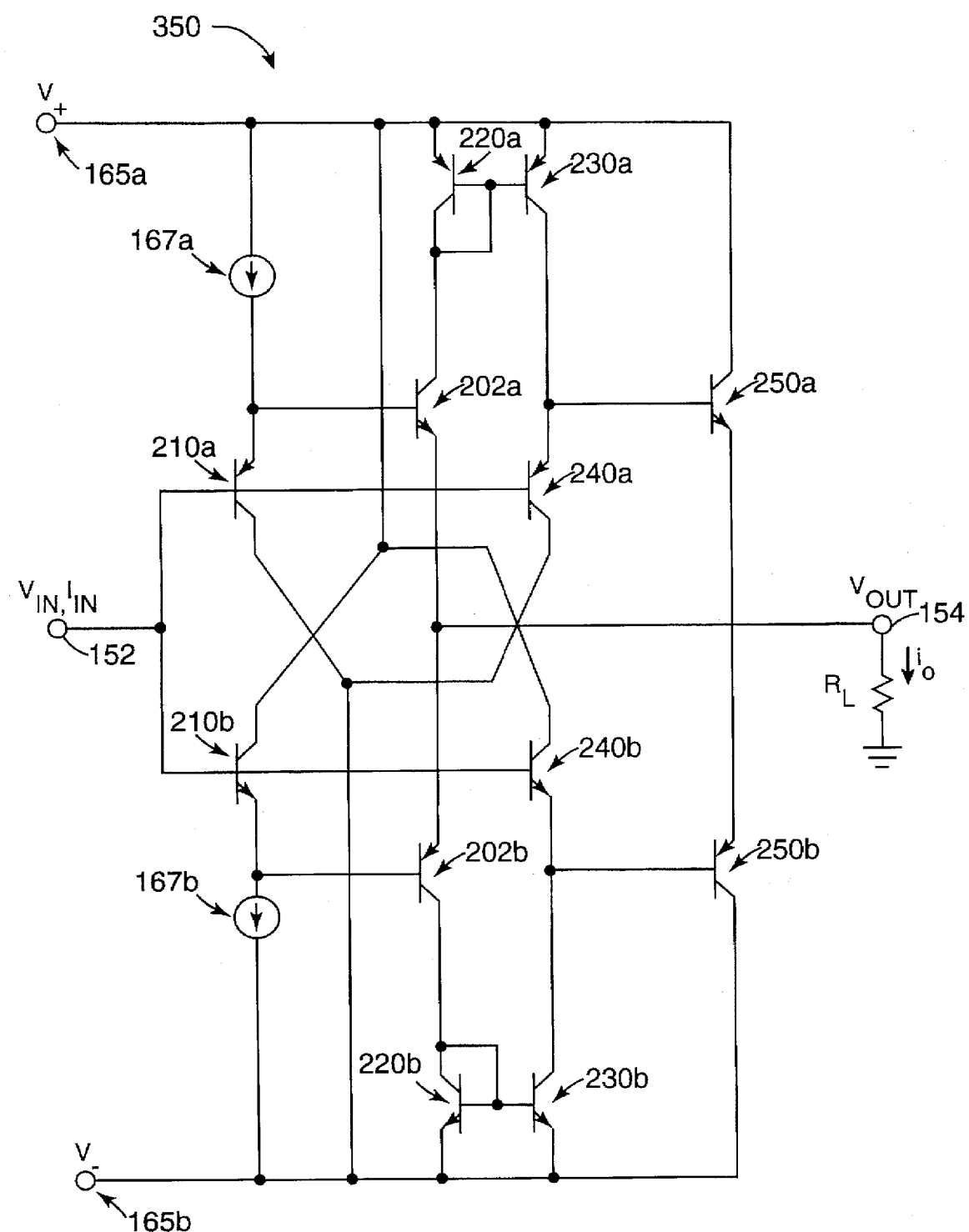
FIG. 10 is a schematic illustration of one specific bipolar output stage in accordance with another embodiment of the present invention.

With reference to FIG. 10, one bipolar output stage 350 in accordance with another embodiment of the present invention will be described. Note that bipolar output stage 350 is a bipolar variation of the output stage 200 of FIG. 5, which is an output stage designed with npn and pnp type transistors. As in FIG. 9, the non-mirrored components of the bipolar output stage 350 are indicated with the marker "a" appended to their respective reference numbers while the mirrored components are indicated with the marker "b" appended to their respective components.

Thus, in the specific embodiment of FIG. 10, the positive error stage includes: an npn transistor 202a and a pnp transistor 210a while the negative error stage includes a pnp transistor 202b and an npn transistor 210b; the positive current mirror stage includes two pnp transistors 220a and 230a while the negative current mirror stage includes two npn transistors 220b and 230b; and the positive amplifying stage includes a pnp transistor 240a and an npn transistor 250a while the negative amplifying stage includes an npn transistor 240b and a pnp transistor 250b.

Modifications such as inserting a gain resistor or a buffer amplifier between the emitter of 202a (or the emitter of 202b) in parallel with the output 154, or inserting a gain resistor or a buffer amplifier in series with both emitters and the output 154 are contemplated. The corresponding results on the behavior of the bipolar output stage 350 are similar to those described above in reference to FIGS. 5–7. Additionally, any of the bipolar transistor may be replaced with FET transistors, with corresponding results on the behavior of the bipolar output stage 350 similar to those 20 described above with reference to FIG. 8.

Although only a few embodiments of the present invention have been described in detail, it should be understood that the present invention may be embodied in many other specific forms without departing from the spirit or scope of the invention. For example, while the described embodiments had a voltage gain of unity, some embodiments of the present invention include non-unity voltage gain.

In other embodiments, the current mirror may take any suitable form. By way of example, the current mirror may be a computer controlled programmable current source which senses the current control signal $I_c$, and generates a corresponding $I_d$. In a similar manner, the error stage and the current mirror can be combined into a single computer controlled stage which senses a difference between the output signal and generates a corresponding $I_d$.

As a further example, the bipolar and FET technologies may both be used within the circuitry. This may be particularly appropriate in situations where the output stage is intended to drive high power devices such as electrical motors. The amplifying stage would then typically utilize bipolar transistors, while the error stage and current mirror may utilize FETs.

While many of the described embodiments are referred to as output stages, this is a term of the art and is not intended to be limiting. The circuit of the present invention is suitable in any application wherein a buffer amplifier, power amplifier, etc. is required.

Therefore, the present examples and embodiments are to be considered as illustrative and not restrictive, and the invention is not to be limited to the details given herein, but may be modified within the scope of the appended claims.

I claim

1. An output stage comprising:

an input;

an output;

an error stage coupled between the input and the output and responsive to a difference between an input signal present on the input and an output signal present on the output, the error stage being operative to generate a current control signal related to the difference between the input signal and the output signal;

a current mirror coupled to the error stage and responsive to the current control signal to generate a demand driven current signal related to a magnitude of the current control signal; and an amplification stage coupled between the input and the output, the amplification stage being responsive to the input signal and to the demand driven current signal to generate the output signal on the output such that a voltage of the output signal is substantially equal to a voltage of the input signal.

2. An output stage as recited in claim 1 wherein the current mirror includes:

a first transistor having a base, a collector and an emitter, wherein the current control signal applied to the base of the first transistor can control a flow of current through the first transistor between the collector and the emitter; and a second transistor having a base, a collector and an emitter, wherein the current control signal applied to the base of the second transistor can control a flow of current through the second transistor between the collector and the emitter, wherein the base and collector of the first transistor and the base of the second transistor are electrically coupled together and are coupled to the current control signal, the emitters of both the first and second transistors are electrically coupled together and are electrically coupled to a power source, and the demand driven current signal is generated at the collector of the second transistor.

3. An output stage as recited in claim 2 wherein the first transistor is a first pnp transistor and the second transistor is a second pnp transistor.

4. An output stage as recited in claim 2 wherein the first transistor is a first p-channel field effect transistor and the second transistor is a second p-channel field effect transistor.

5. An output stage as recited in claim 1 wherein the error stage includes:

a first transistor having a base, a collector, and an emitter, wherein a control signal applied to the base of the first transistor can control a flow of current through the first transistor between the collector and the emitter of the first transistor; and a second transistor having a base, a collector, and an emitter, wherein the input signal applied to the base of the second transistor can control a flow of current through the second transistor between the collector and the emitter of the second transistor, wherein the base of the first transistor and the emitter of the second transistor are electrically coupled together and coupled to a substantially constant current source, the base of the second transistor is electrically coupled to the input, the collector of the second transistor is electrically coupled to a ground reference, the emitter of the first transistor is electrically coupled to the output, and the current control signal is generated at the collector of the first transistor.

6. An output stage as recited in claim 5 wherein the first transistor is an npn transistor and the second transistor is a pnp transistor.

7. An output stage as recited in claim 5 wherein the first transistor is an n-channel field effect transistor and the second transistor is a p-channel field effect transistor.

8. An output stage as recited in claim 1 wherein the amplification stage includes:

a first transistor having a base, a collector, and an emitter, wherein a control signal applied to the base of the first transistor can control a flow of current through the first transistor between the collector and the emitter of the first transistor;

a second transistor having a base, a collector, and an emitter, wherein the input signal applied to the base of the second transistor can control a flow of current through the second transistor between the collector and the emitter of the second transistor, wherein the base of the second transistor is electrically coupled with the input, the base of the first transistor and the emitter of the second transistor are electrically coupled together and are coupled to the demand driven current signal, and the output signal is generated at the emitter of the first transistor which is electrically coupled with the output.

9. An output stage as recited in claim 8 wherein the first transistor is an npn transistor and the second transistor is a pnp transistor.

10. An output stage as recited in claim 8 wherein the first transistor is an n-channel transistor and the second transistor is a p-channel transistor.

11. An output stage as recited in claim 8 wherein the error stage includes:

a third transistor having a base, a collector, and an emitter, wherein a control signal applied to the base of the third transistor can control a flow of current through the third transistor between the collector and the emitter of the third transistor; and a fourth transistor having a base, a collector, and an emitter, wherein the input signal applied to the base of the fourth transistor can control a flow of current through the fourth transistor between the collector and the emitter of the fourth transistor, wherein the base of the third transistor and the emitter of the fourth transistor are electrically coupled together and are coupled to a current source, the base of the fourth transistor is electrically coupled to the input, the collector of the fourth transistor is electrically coupled to a ground reference, the emitter of the third transistor is electrically coupled to the output, and the current control signal is generated at the collector of the third transistor.

12. An output stage as recited in claim 8 wherein the current mirror includes:

a third transistor having a base, a collector and an emitter, wherein the current control signal applied to the base of the third transistor can control a flow of current through the third transistor between the collector and the emitter; and a fourth transistor having a base, a collector and an emitter, wherein the current control signal applied to the base of the fourth transistor can control a flow of current through the fourth transistor between the collector and the emitter, wherein the base and collector of the third transistor and the base of the fourth transistor are electrically coupled together and are electrically coupled to the current control signal, the emitters of both the third and fourth transistors are electrically coupled together and are electrically coupled to a power source, and the demand driven current signal is generated at the collector of the fourth transistor.

13. An output stage as recited in claim 11 wherein the error stage includes:

a fifth transistor having a base, a collector, and an emitter, wherein a control signal applied to the base of the fifth transistor can control a flow of current through the fifth transistor between the collector and the emitter of the fifth transistor; and a sixth transistor having a base, a collector, and an emitter, wherein the input signal applied to the base of the sixth transistor can control a flow of current through the sixth transistor between the collector and the emitter of the sixth transistor, wherein the base of the fifth transistor and the emitter of the sixth transistor are electrically coupled together and electrically coupled to a current source, the base of the sixth transistor is electrically coupled to the input, the collector of the sixth transistor is electrically coupled to a ground reference, the emitter of the fifth transistor is electrically coupled to the output, and the current control signal is generated at the collector of the fifth transistor.

14. An output stage as recited in claim 1 further comprising a current source coupled to the error stage.

15. An output stage as recited in claim 14 wherein the current source is an active current source having a first active terminal coupled to a power source and a second active terminal coupled to the error stage, the active current source generating a current flowing between the first active terminal and the second active terminal.

16. An output stage as recited in claim 14 wherein the current source is a resistor having a first terminal coupled to a power source and a second terminal coupled to the error stage, the resistor arranged to generate a current flowing between the first terminal and the second terminal.

17. An output stage as recited in claim 1 wherein the output signal is a power amplified signal and a current of the output signal is greater than a current of the input signal.

18. An output stage as recited in claim 1 wherein the output stage is a bipolar output stage operable to provide bipolar currents through the output.

19. An output stage as recited in claim 18 wherein the error stage includes a positive error stage and a negative error stage, the current mirror includes a positive current mirror stage and a negative mirror stage, and the amplification stage includes a positive amplification stage and a negative amplification stage.

20. An output stage as recited in claim 19 wherein the current control signal has a positive current control signal and a negative current control signal, the demand driven current control signal has a positive demand driven current control signal and a negative demand driven current control signal, and wherein:

the positive mirror stage includes:

a first transistor having a base, a collector and an emitter, wherein the positive current control signal applied to the base of the first transistor can control a flow of current through the first transistor between the collector and the emitter; and a second transistor having a base, a collector and an emitter, wherein the positive current control signal applied to the base of the second transistor can control a flow of current through the second transistor between the collector and the emitter, wherein the base and collector of the first transistor and the base of the second transistor are electrically coupled together and are coupled to the positive current control signal, the emitters of both the first and second transistors are electrically coupled together and are electrically coupled to a positive voltage power source, and the positive demand driven current signal is generated at the collector of the second transistor; and the negative mirror stage includes:

a third transistor having a base, a collector and an emitter, wherein the negative current control signal applied to the base of the third transistor can control a flow of current through the third transistor between the collector and the emitter; and a fourth transistor having a base, a collector and an emitter, wherein the negative current control signal applied to the base of the fourth transistor can control a flow of current through the fourth transistor between the collector and the emitter, wherein the base and collector of the third transistor and the base of the fourth transistor are electrically coupled together and are coupled to the negative current control signal, the emitters of both the third and fourth transistors are electrically coupled together and are electrically coupled to a negative voltage power source, and the negative demand driven current signal is generated at the collector of the fourth transistor.

21. An output stage as recited in claim 20 wherein the first transistor is a first pnp transistor, the second transistor is a pnp transistor, the third transistor is a first npn transistor, and the fourth transistor is a second npn transistor.

22. An output stage as recited in claim 19 wherein the current control signal has a positive current control signal and a negative current control signal, and wherein:

the positive error stage includes:

a first transistor having a base, a collector, and an emitter, wherein a control signal applied to the base of the first transistor can control a flow of current through the first transistor between the collector and the emitter of the first transistor; and second transistor having a base, a collector, and an emitter, wherein the input signal applied to the base of the second transistor can control a flow of current through the second transistor between the collector and the emitter of the second transistor, wherein the base of the first transistor and the emitter of the second transistor are electrically coupled together and coupled to a first substantially constant current source, the base of the second transistor is electrically coupled to the input, the collector of the second transistor is electrically coupled to a negative reference voltage, the emitter of the first transistor is electrically coupled to the output, and the positive current control signal is generated at the collector of the first transistor; and the negative error stage includes:
  a third transistor having a base, a collector, and an emitter, wherein a control signal applied to the base of the first transistor can control a flow of current through the first transistor between the collector and the emitter of the first transistor; and
  a fourth transistor having a base, a collector, and an emitter, wherein the input signal applied to the base of the fourth transistor can control a flow of current through the fourth transistor between the collector and the emitter of the fourth transistor,
  wherein the base of the third transistor and the emitter of the fourth transistor are electrically coupled together and coupled to a second substantially constant current source, the base of the fourth transistor is electrically coupled to the input, the collector of the fourth transistor is electrically coupled to a positive reference voltage, the emitter of the third transistor is electrically coupled to the output, and the negative current control signal is generated at the collector of the third transistor.

23. An output stage as recited in claim 19 wherein the demand driven current signal has a positive demand driven current signal and a negative demand driven current signal, and wherein:

the positive amplification stage includes:
  a first transistor having a base, a collector, and an emitter, wherein a control signal applied to the base of the first transistor can control a flow of current through the first transistor between the collector and the emitter of the first transistor;
  a second transistor having a base, a collector, and an emitter, wherein the input signal applied to the base of the second transistor can control a flow of current through the second transistor between the collector and the emitter of the second transistor,
  wherein the base of the second transistor is electrically coupled with the input, the base of the first transistor and the emitter of the second transistor are electrically coupled together and are coupled to the positive demand driven current signal, and the output signal is generated at the emitter of the first transistor which is electrically coupled with the output; and the negative amplification stage includes:
  a third transistor having a base, a collector, and an emitter, wherein a control signal applied to the base of the third transistor can control a flow of current through the third transistor between the collector and the emitter of the third transistor; and
  a fourth transistor having a base, a collector, and an emitter, wherein the input signal applied to the base of the fourth transistor can control a flow of current through the fourth transistor between the collector and the emitter of the fourth transistor,
  wherein the base of the fourth transistor is electrically coupled with the input, the base of the third transistor and the emitter of the fourth transistor are electrically coupled together and are coupled to the negative demand driven current signal, and the output signal is generated at the emitter of the third transistor which is electrically coupled with the output and the first transistor.

24. An output stage as recited in claim 23 wherein the first transistor is a first npn transistor, the second transistor is a first pnp transistor, the third transistor is a second pnp transistor, and the fourth transistor is a second npn transistor.

25. An output stage as recited in claim 1 wherein the error stage is coupled to the output by a resistor having a first terminal connected to the error stage and a second terminal connected to the output.

26. An output stage as recited in claim 1 wherein the error stage is coupled to the output by a buffer amplifier having an input terminal connected to the output and an output terminal connected to the error stage, the buffer amplifier being arranged such that a voltage on the output terminal is related to a voltage on the input terminal and being further arranged such that substantially no current flows through the input terminal.

27. An output stage as recited in claim 1 wherein the output stage is powered by a voltage source $V_+$, a maximum voltage drop across the error stage is $V_{SAT}$, a maximum voltage drop across the amplification stage is $V_{BE}$, and thus the maximum output voltage $V_{OUT}=V_+-(V_{SAT}+V_{BE})$, and wherein a total voltage drop $V_{SAT}+V_{BE}$ is no greater than a voltage drop across a basic emitter-follower output stage.

28. A power amplification circuit comprising:
  an amplifier operative to generate a power amplified output signal from an input signal having a voltage Vin and a current Iin, the output signal having a voltage Vout and a current Iout, wherein the power amplification is achieved mainly by amplifying a demand driven current Id by a desired amplification factor to generate Iout such that Iout is greater than Iin;
  a demand driven current source arranged to sense the difference between Vout and a desired Vout and generate the demand driven current Id such that a magnitude of the difference between Vout and the desired Vout is reduced and the demand driven current Id is minimized.

29. A power amplification circuit as recited in claim 28 wherein the output signal is generated across a load R1 and the current Iout drives the load R1 to generate Vout.

30. A power amplification circuit as recited in claim 28 wherein the power amplification supplies a bipolar output current Iout.

31. A power amplification circuit as recited in claim 28 wherein the power amplification circuit supplies a unipolar output current Iout.

32. A method of buffering an electrical signal comprising the steps of:
  receiving an input signal having a voltage Vin and a current Iin;
  generating a buffered output signal from the input signal, the output signal having a voltage Vout and a current Iout, the current Iout being generated such that a resistive load R1 driven by the output signal has a minimal effect on the voltage Vout, wherein the current Iout is produced mainly by amplifying a demand driven current Id to generate Iout;
  sensing a difference between the Vout and a desired Vout;
  providing a current control signal Ic related to the difference between the Vout and the desired Vout; and
  generating a demand driven current Id by amplifying the current control signal Ic, the current Id generated such that the difference between Vout and the desired Vout is reduced while the demand driven current Id is minimized.

33. A method of buffering an electrical signal as recited in claim 32 wherein the current Id is generated through a current mirror which mirrors and amplifies the current control signal Ic.

34. A method of buffering an electrical signal as recited in claim 32 wherein the step of providing a current control signal Ic includes the substeps of:

receiving a substantially constant current Is; and amplifying by a substantially constant current gain a portion of the substantially constant current Is to generate Ic, a magnitude of the portion of the substantially constant current related to the difference between the Vout and the desired Vout.

35. A method of buffering an electrical signal as recited in claim 32 wherein the step of receiving the input signal is capable of receiving a bipolar input signal and the step of generating a buffered output signal is capable of generating a bipolar output signal.

* * * * *

UNITED STATES PATENT AND TRADEMARK OFFICE
CERTIFICATE OF CORRECTION

PATENT NO. : 5,754,066
DATED : May 19, 1998
INVENTOR(S) : Smith

It is certified that error appears in the above-indentified patent and that said Letters Patent is hereby corrected as shown below:

Column 3, line 27, change "110" to --110--
Column 3, line 47, change "I$_E$2" to --I$_{E2}$--
Column 8, line 48, change "stabe" to --stage--
Column 10, line 49, after "those", delete "20"

Signed and Sealed this

Second Day of February, 1999

Attest:

Attesting Officer

Acting Commissioner of Patents and Trademarks